United States Patent
Frattalone

(10) Patent No.: US 10,555,429 B2
(45) Date of Patent: Feb. 4, 2020

(54) METHODS AND APPARATUS FOR CREATING GIRIH STRAPWORK PATTERNS

(71) Applicant: John Frattalone, Brooklyn, NY (US)

(72) Inventor: John Frattalone, Brooklyn, NY (US)

( * ) Notice: Subject to any disclaimer, the term of this patent is extended or adjusted under 35 U.S.C. 154(b) by 0 days.

(21) Appl. No.: 15/942,623

(22) Filed: Apr. 2, 2018

(65) Prior Publication Data

US 2019/0082550 A1  Mar. 14, 2019

Related U.S. Application Data

(63) Continuation of application No. 15/291,887, filed on Oct. 12, 2016, now Pat. No. 9,936,597, which is a
(Continued)

(51) Int. Cl.
*H02G 3/04* (2006.01)
*B60R 16/02* (2006.01)
(Continued)

(52) U.S. Cl.
CPC .............. *H05K 7/02* (2013.01); *E04F 13/07* (2013.01); *E04F 13/08* (2013.01);
(Continued)

(58) Field of Classification Search
CPC .. H05K 7/02; E04F 13/07; E04F 13/24; E04F 13/26; E04F 13/30; E04F 15/02144; E04F 19/00
(Continued)

(56) References Cited

U.S. PATENT DOCUMENTS

| 4,133,152 A | * | 1/1979 | Penrose | .................. B44C 3/123 273/156 |
| 4,343,471 A | * | 8/1982 | Calvert | ................. A63F 9/0669 273/157 R |

(Continued)

OTHER PUBLICATIONS

"Girih Tiling Patterns in Google SketchUp"—.pdf document, Dec. 2009, www.mathforum.org/sketchup, http://www.3dvinci.net/mathforum/GirihTiles_TeacherVersion.pdf (Year: 2009).*
(Continued)

*Primary Examiner* — Timothy J Thompson
*Assistant Examiner* — Charles Pizzuto
(74) *Attorney, Agent, or Firm* — Cooley LLP

(57) ABSTRACT

A kit that includes multiple rectilinear elongate polygonal elements having five unique shapes, four of which are concave polygonal elements. In some examples, when arranged with respect to one another, the elements of the kit form a girih strapwork pattern. In one aspect, respective elements in a kit may include bezels or boarders along longer sides to enhance an over/under weaving effect of the girih strapwork pattern. In other aspects, one or more elements may be formed as a tray, and some of the trays may include various components or materials disposed in the tray (e.g., architectural surface materials, biological systems, various electronic components) to provide for a variety of creative designs and structural/sculptural installations for built environments. In some implementations, one or more such trays may have beveled rims so as to appear light and thin when viewed.

15 Claims, 8 Drawing Sheets

Related U.S. Application Data continuation of application No. PCT/US2016/035115, filed on May 31, 2016.

(60) Provisional application No. 62/167,781, filed on May 28, 2015.

(51) Int. Cl.
| | |
|---|---|
| *H02G 3/06* | (2006.01) |
| *H05K 7/02* | (2006.01) |
| *E04F 13/08* | (2006.01) |
| *E04F 13/07* | (2006.01) |
| *E04F 13/24* | (2006.01) |
| *E04F 13/26* | (2006.01) |
| *E04F 13/30* | (2006.01) |
| *E04F 15/02* | (2006.01) |
| *E04F 19/00* | (2006.01) |

(52) U.S. Cl.
CPC .......... *E04F 13/0871* (2013.01); *E04F 13/24* (2013.01); *E04F 13/26* (2013.01); *E04F 13/30* (2013.01); *E04F 15/02144* (2013.01); *E04F 19/00* (2013.01)

(58) Field of Classification Search
USPC .......................................... 174/520; 361/807
See application file for complete search history.

(56) References Cited

U.S. PATENT DOCUMENTS

| | | | | |
|---|---|---|---|---|
| 5,007,220 | A * | 4/1991 | Lalvani | B44C 3/123 |
| | | | | 52/653.1 |
| 6,309,716 | B1 * | 10/2001 | Fisher | B44C 3/12 |
| | | | | 273/157 R |
| 9,936,597 | B2 | 4/2018 | Frattalone | |
| 2014/0056003 | A1 * | 2/2014 | Frattalone | F21K 9/20 |
| | | | | 362/249.06 |

OTHER PUBLICATIONS

"Girih Tiling Patterns in Google SketchUp," www.mathforum.org/sketchup, http://3dvinci.net/mathforum/GirihTiles_TeacherVersion.pdf, Dec. 2009, 16 pages.

Chinese Office Action dated Jun. 6, 2019 for Chinese Application No. 201680043399.9, 6 pages.

Extended European Search Report dated Mar. 8, 2019 for European Application No. 16800860.5, 7 pages.

International Search Report and Written Opinion dated Sep. 1, 2016 for International Application No. PCT/US2016/035115, 8 pages.

Salmiya, Glimpses From the Middle East, Blogger.com, Apr. 26, 2009 [retrieved on Jul. 26, 2016]. Retrieved from the internet: <URL http://al.qanaa.blogspot.com/2009_04_01_archive.html>, 7 pages.

* cited by examiner

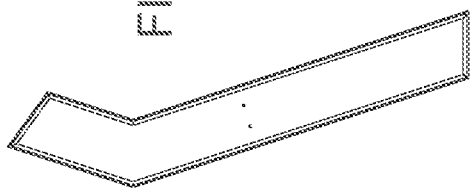
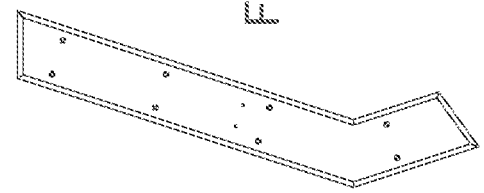
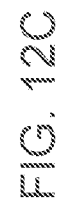
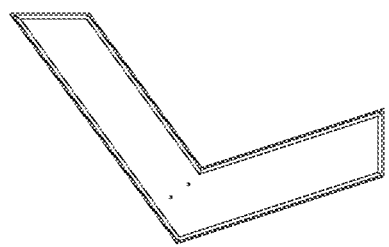
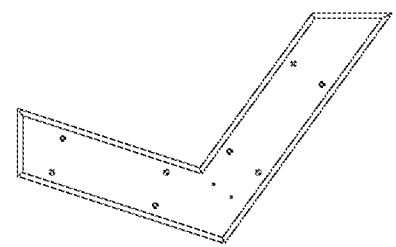
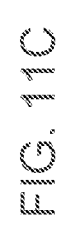
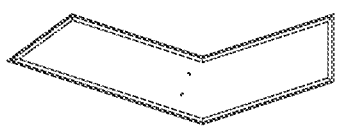
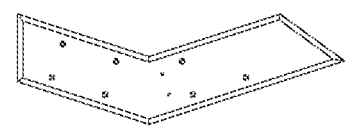
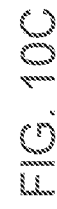
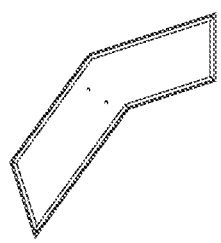
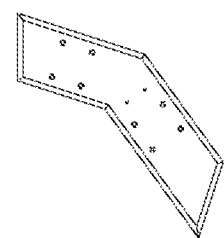
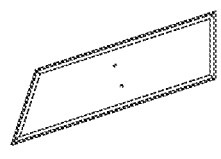
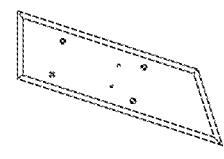
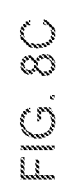

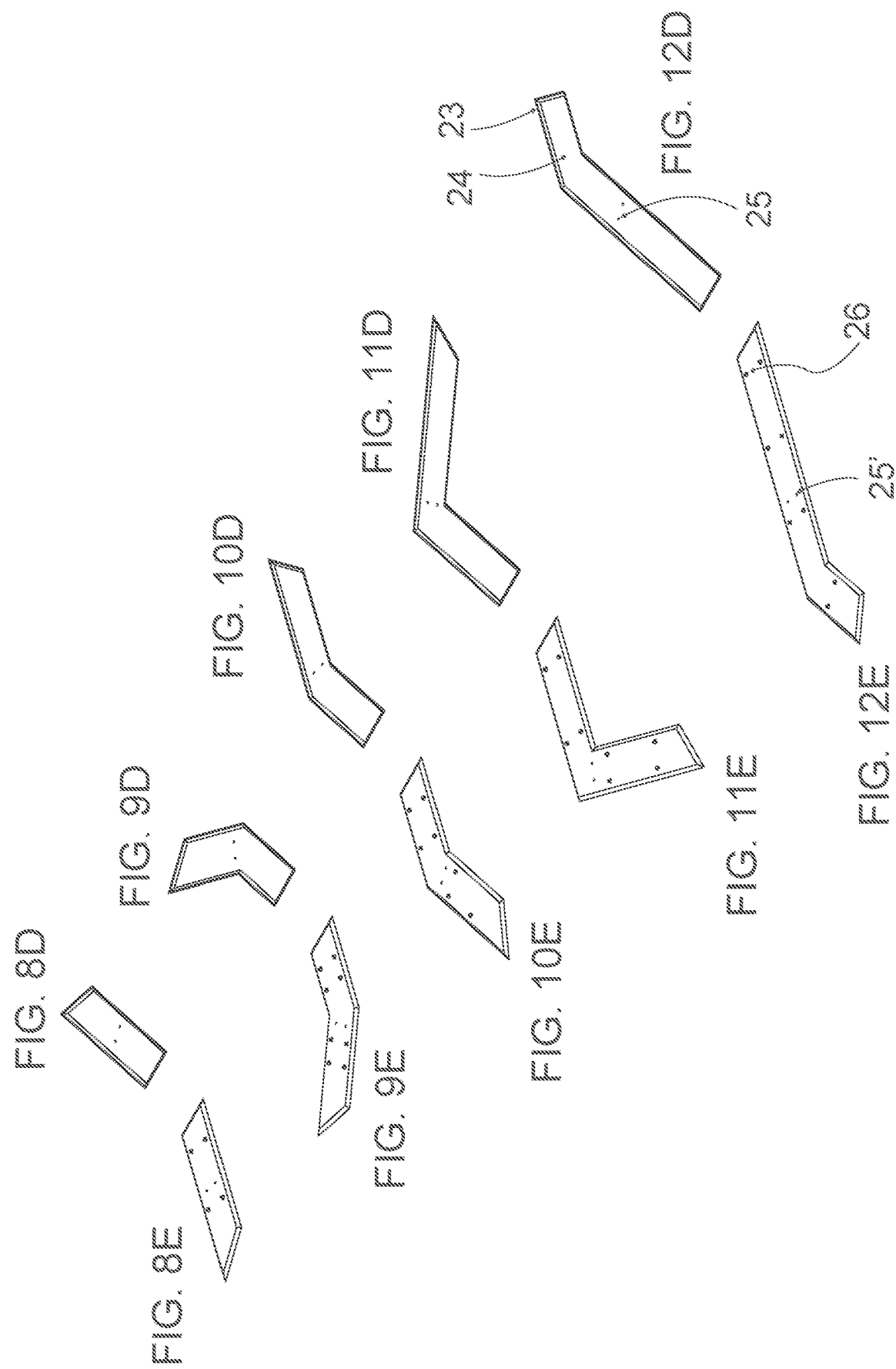

METHODS AND APPARATUS FOR CREATING GIRIH STRAPWORK PATTERNS

CROSS-REFERENCE TO RELATED APPLICATIONS

This application a continuation application of U.S. application Ser. No. 15/291,887, filed Oct. 12, 2016, and entitled "Methods and Apparatus For Creating Girih Strapwork Patterns," which is a bypass continuation application of International Application No. PCT/US2016/035115, filed on May 31, 2016 and entitled "Methods and Apparatus for Creating Girih Strapwork Patterns," which in turn claims a priority benefit to U.S. provisional Application Ser. No. 62/167,781, entitled "Modular Kinetic Mechanical System Integrating Electrical Components," and filed on May 28, 2015. Each of the aforementioned applications is herein expressly incorporated by reference in its entirety.

BACKGROUND

The "girih" tiles (from the Persian word meaning "knot") are a set of five tiles that are used in various combinations to create Islamic geometric patterns for decoration of buildings in Islamic architecture. FIG. 1 shows a top view of the set (1) of five girih tiles in basic outline shape. The five shapes of the tiles are: a regular decagon (6) with ten interior angles of 144°; an elongated (irregular convex) hexagon (5) with interior angles of 72°, 144°, 144°, 72°, 144°, 144°; a bow tie (non-convex hexagon) (4) with interior angles of 72°, 72°, 216°, 72°, 72°, 216°; a regular pentagon (3) with five interior angles of 108°; and a rhombus (2) with interior angles of 72°, 108°, 72°, 108°. All sides of these tiles have the same length, and all of their angles are multiples of 36° ($\pi/5$ radians). All of the tiles, except the pentagon, have bilateral (reflection) symmetry through two perpendicular lines. Some tiles have additional symmetries; for example, the decagon has tenfold rotational symmetry (rotation by 36°), and the pentagon has fivefold rotational symmetry (rotation by 72°).

The girih tiles are each decorated with piece-wise straight lines that are typically painted on the tiles and that form a portion of a simulated weaving pattern, referred to as a "girih strapwork pattern." FIG. 2 shows a top view of a set (7) of the five Girih tiles with their corresponding portions of the girih strapwork pattern. In particular, the respective pattern portions on the tiles include piece-wise straight lines that cross the boundaries of the tiles at the center of an edge at 54° ($3\pi/10$) to the edge, with two intersecting lines crossing each edge of a tile. FIG. 3 shows the five Girih tiles of FIG. 2 placed together to form an example of the strapwork pattern. FIG. 4 shows a larger and more extended example of a girih strapwork pattern formed by several tiles, including mostly the hexagon tile (5") and the bow tie tile (4"), with a single decagon tile (6") at the center.

SUMMARY

Various inventive subject matter disclosed herein relates to kits that include multiple rectilinear elongate polygonal elements having five unique shapes. In one example implementation, four of the unique shapes are concave polygonal elements. In some examples, when arranged with respect to one another, the elements of the kit form a girih strapwork pattern without requiring the use of the conventional girih tiles. In one aspect, respective elements in a kit may include bezels or boarders along longer sides (e.g., to enhance an over/under weaving effect of the girih strapwork pattern). In another aspect, one or more elements of a kit may be formed as a tray, and some of the trays may include various components or materials disposed in the tray (e.g., architectural surface materials, biological systems, various electronic components) to provide for a variety of creative designs and structural/sculptural installations for built environments, based on a girih strapwork pattern. In some implementations, one or more such trays may have beveled rims so as to appear light and thin when viewed (as part of an architectural installation involving significant "negative space" amidst a girih strapwork pattern).

The Inventor has recognized and appreciated that substituting kits of elements according to the inventive concepts disclosed herein in place of the larger traditional girih tiles is advantageous to designers and engineers insofar as the elements in such kits are a fraction of the size of the traditional girih tiles. Thus, such kits of elements reduce an overall surface area of required materials to otherwise create a girih strapwork pattern. Moreover, in some cases, the elements of the kit may be equipped or combined with various ornamental components (e.g., architectural surface materials of different types) or functional components (e.g., electronic components or biological systems) according to the inventive concepts disclosed herein; in such implementations, the streamlined size of the kit elements may reduce the total number of unique parts or materials needed for an architectural installation replicating a girih strapwork pattern.

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

BRIEF DESCRIPTION OF THE DRAWINGS

The skilled artisan will understand that the drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like features (e.g., functionally similar and/or structurally similar elements).

FIGS. 8A-8E are top, bottom, side, top right isometric, and lower left isometric views of the element 9 of the kit shown in FIG. 5, in which the element is formed as a tray (e.g., for holding architectural surface materials, biological systems, or various electronic components), according to exemplary implementations of the inventive concepts disclosed herein.

FIGS. 9A-9E are top, bottom, side, top right isometric, and lower left isometric views of the element 10 of the kit shown in FIG. 5, in which the element is formed as a tray (e.g., for holding architectural surface materials, biological systems, or various electronic components), according to exemplary implementations of the inventive concepts disclosed herein.

FIGS. 10A-10E are top, bottom, side, top right isometric, and lower left isometric views of the element 11 of the kit shown in FIG. 5, in which the element is formed as a tray (e.g., for holding architectural surface materials, biological systems, or various electronic components), according to exemplary implementations of the inventive concepts disclosed herein.

FIGS. 11A-11E are top, bottom, side, top right isometric, and lower left isometric views of the element 12 of the kit shown in FIG. 5, in which the element is formed as a tray (e.g., for holding architectural surface materials, biological systems, or various electronic components), according to exemplary implementations of the inventive concepts disclosed herein.

FIGS. 12A-12E are top, bottom, side, top right isometric, and lower left isometric views of the element 13 of the kit shown in FIG. 5, in which the element is formed as a tray (e.g., for holding architectural surface materials, biological systems, or various electronic components), according to exemplary implementations of the inventive concepts disclosed herein.

DETAILED DESCRIPTION

Following below are more detailed descriptions of various concepts related to, and embodiments of, inventive methods and apparatus for creating girih strapwork patterns. It should be appreciated that various concepts introduced above and discussed in greater detail below may be implemented in any of numerous ways, as the disclosed concepts are not limited to any particular manner of implementation. Examples of specific implementations and applications are provided primarily for illustrative purposes.

Figure 1:
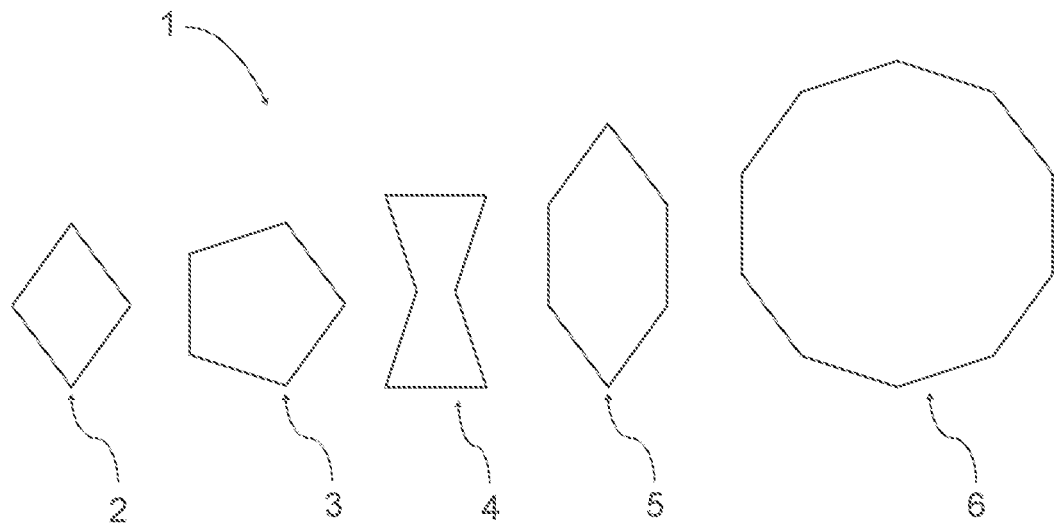
FIG. 1 shows a top view of the five traditional girih tiles in basic outline shape.
Figure 2:
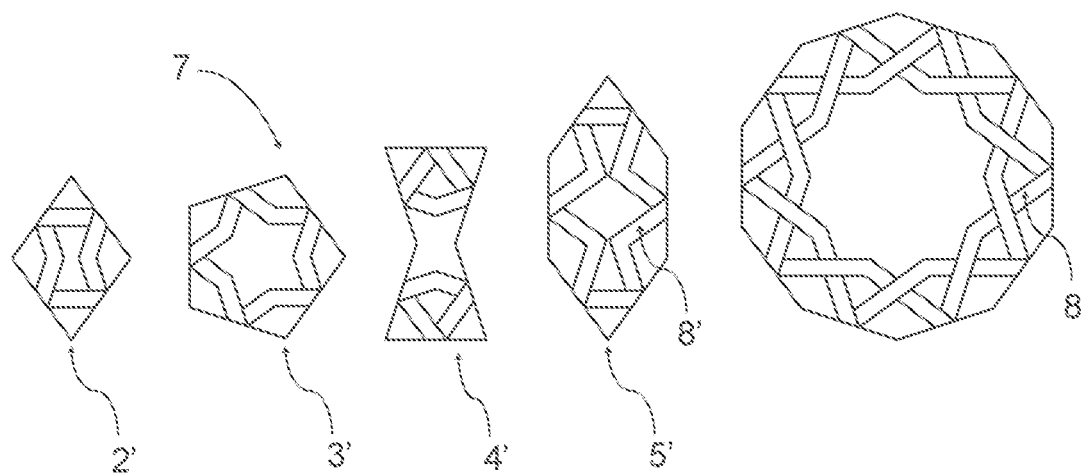
FIG. 2 shows a top view of the five traditional girih tiles decorated with piece-wise straight lines.
Figure 3:
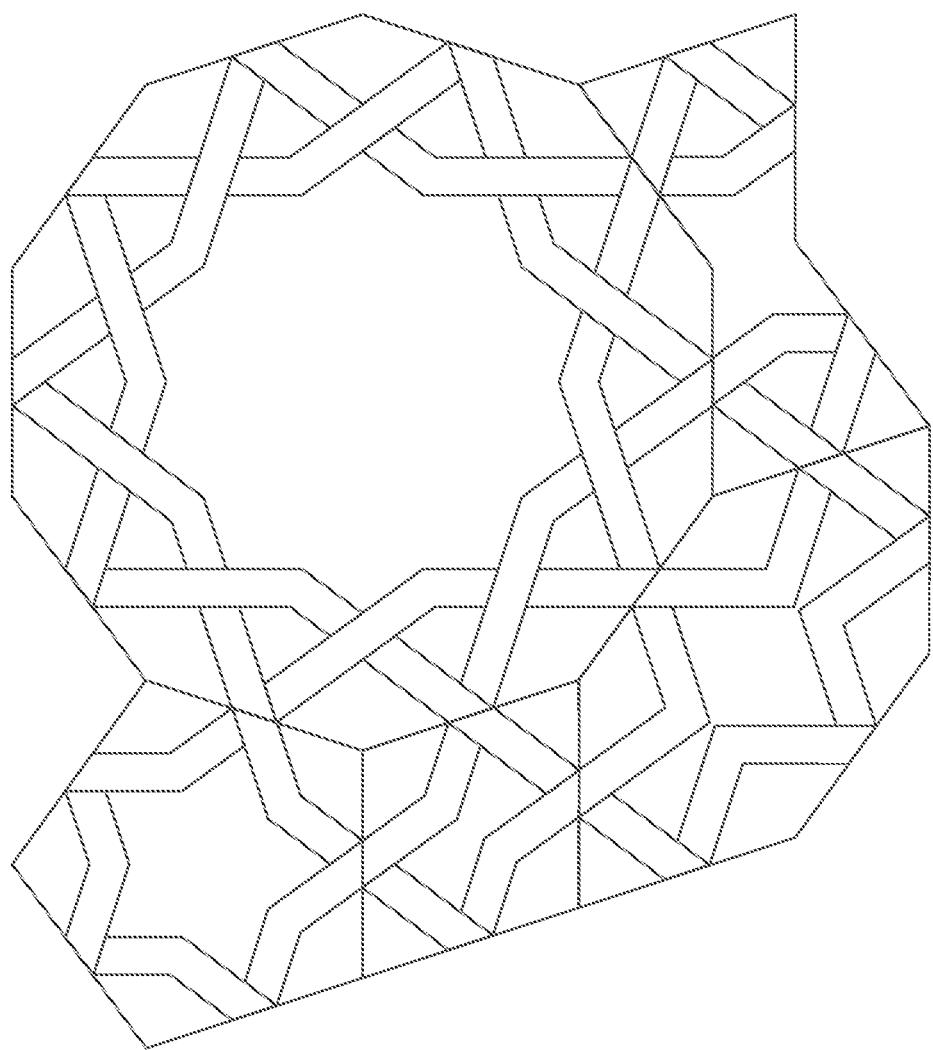
FIG. 3 shows the five traditional girih tiles of FIG. 2 placed together to create a portion of an illustrative girih strapwork pattern.
Figure 4:
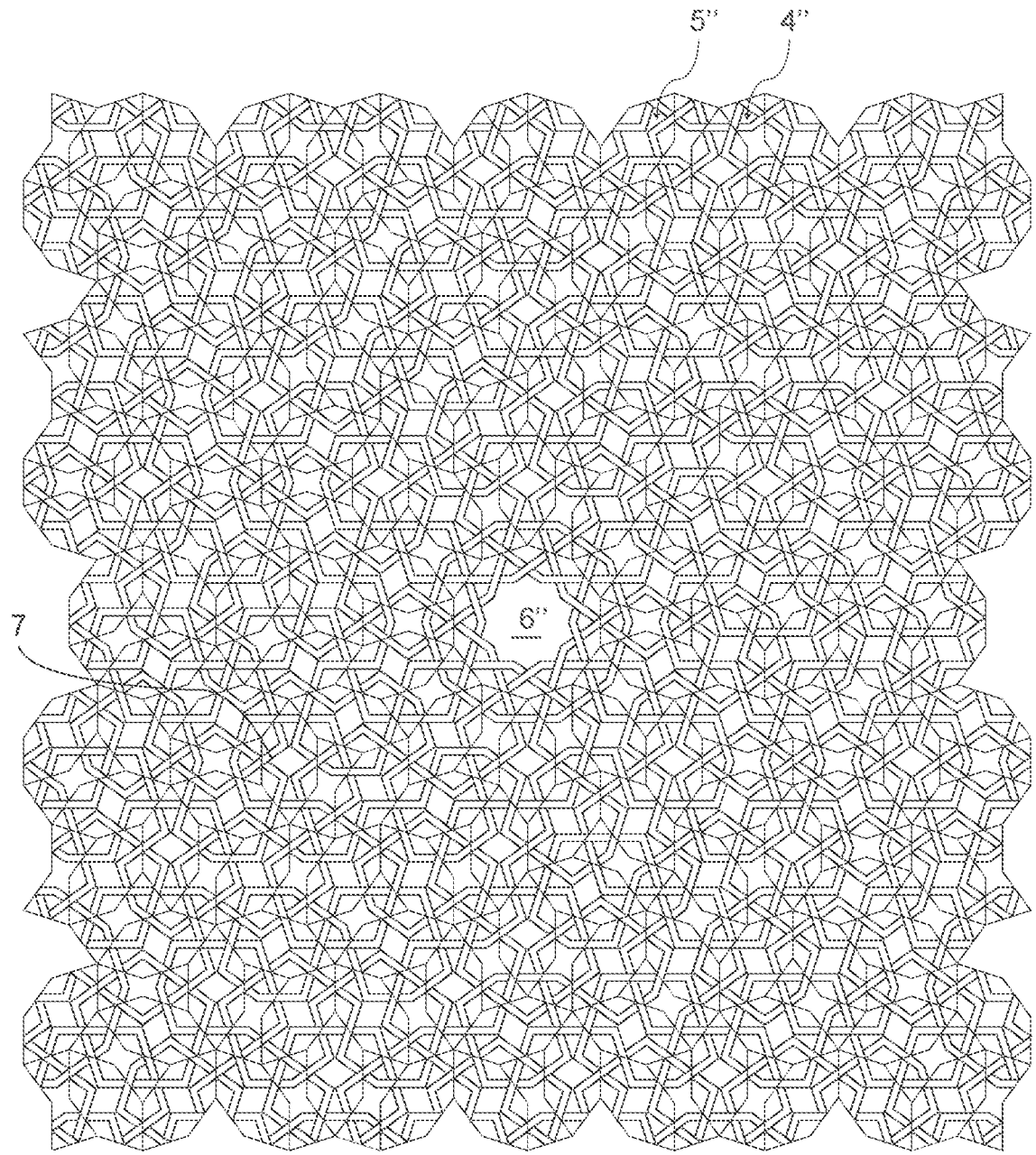
FIG. 4 shows a larger and more extended example of a girih strapwork pattern formed by several girih tiles taken from the set of five traditional tiles shown in FIG. 2.
Figure 5:
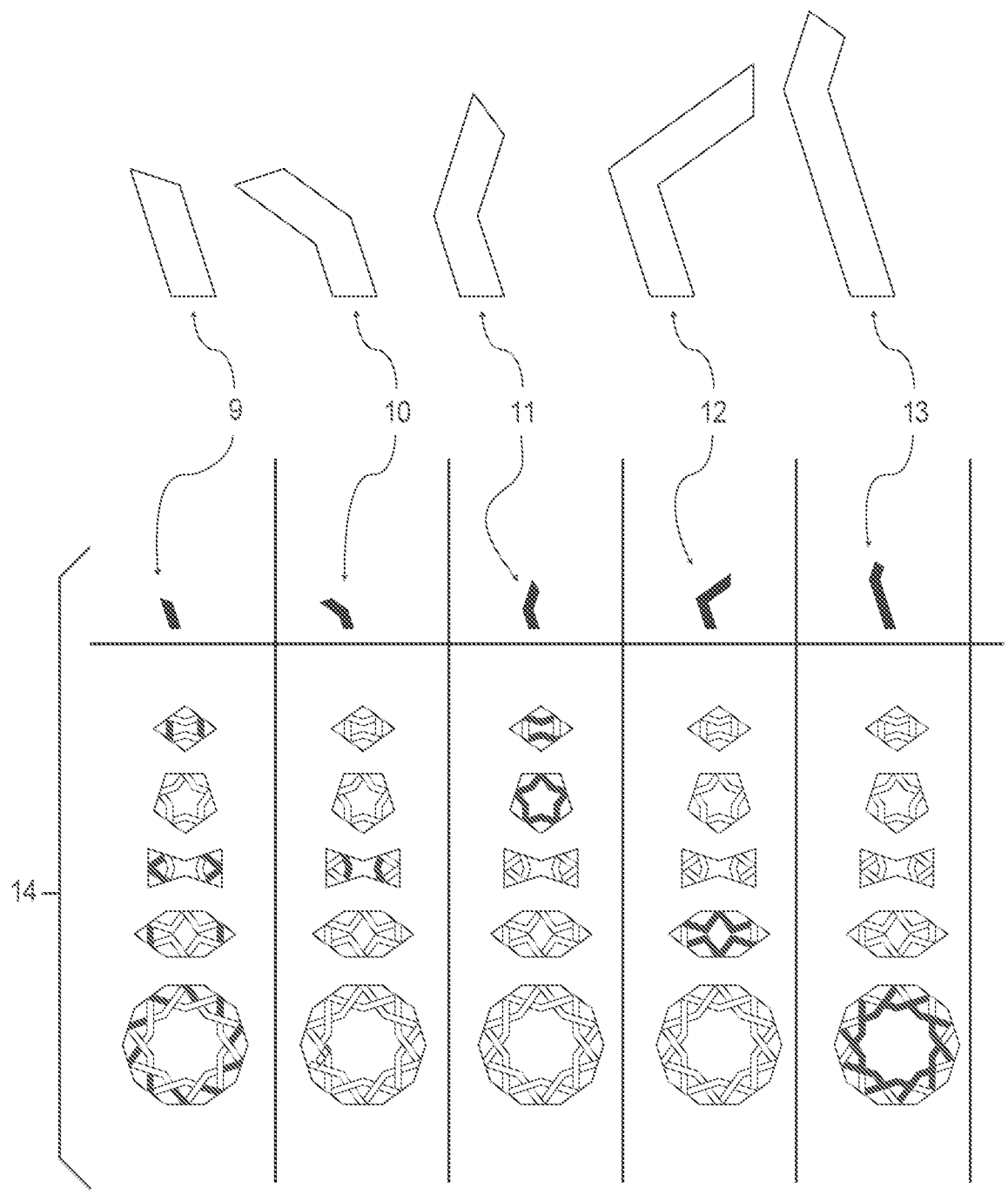
FIG. 5 shows a top view of a kit including five rectilinear elongate polygonal elements that can be arranged with respect to one another to form a girih strapwork pattern, according to exemplary implementations of the inventive concepts disclosed herein.

FIG. 5 shows a top view of a kit including five rectilinear elongate polygonal elements 9, 10, 11, 12, and 13 each having a unique shape, wherein the elements can be arranged with respect to one another to form a girih strapwork pattern, according to exemplary implementations of the inventive concepts disclosed herein. As can be seen in FIG. 5, four of the elements 10, 11, 12, and 13 are concave polygons (i.e., having an interior angle greater than 180 degrees). In one aspect, each of the elements has a uniform width. The manner in which the respective elements 9, 10, 11, 12, and 13 may be combined to form a girih strapwork pattern may be understood via the matrix 14 shown on the bottom of FIG. 5, which shows the relative correspondence of each element, according to the inventive concepts disclosed herein, to the piece-wise straight lines decorating the set of five traditional girih tiles. In other aspects, as readily seen in FIG. 5, each unique shape has at least two longer sides that are parallel to each other. Furthermore, each unique shape has a first shorter side and a second shorter side constituting respective narrow ends of the unique shape, wherein the first shorter sides of all unique shapes have a first same length, and the second shorter sides of a first group of four unique shapes (e.g., elements 9, 10, 11 and 12) of the five unique shapes have a second same length.

Figure 6:
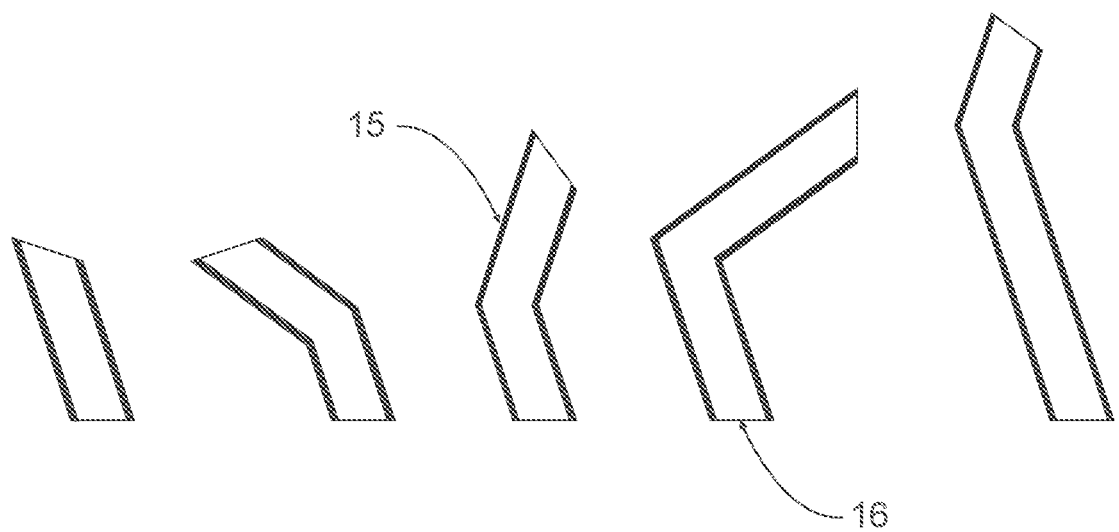
FIG. 6 shows a bezel or border along longer sides of respective elements of the kit shown in FIG. 5, according to exemplary implementations of the inventive concepts disclosed herein.

FIG. 6 illustrates that, in some implementations, each element in the kit has an exposed visible surface between the two or more longer sides that are parallel to each other, and each longer side may include a bezel or a border 15 that is visibly different than the exposed visible surface. In some implementations, the bezel or border may be made of a different material than the material constituting the exposed visible surface (e.g., the exposed visible surface may be plastic or in part semiconductor components, and the bezel or border may be metallic). In some examples, such a bezel or border enhances an over/under weaving effect of the girth strapwork pattern when the elements of the kit are arranged together. To this end, the first and second shorter sides of all unique shapes may not include such a bezel or border 15 to facilitate the enhanced over/under weaving effect. In other implementations, the choice can be made to not retain the bezel or border along the longer sides of elements, and to instead present a borderless, edge-to-edge surface. This may be desirable, for example, in the case of LED lighting or video display installations (discussed further below), where the bezel or border 15 could instead be presented through video content or lighting control, and added or taken away at will, with control over opacity, color, more advanced motion-graphic effects.

Figure 7:
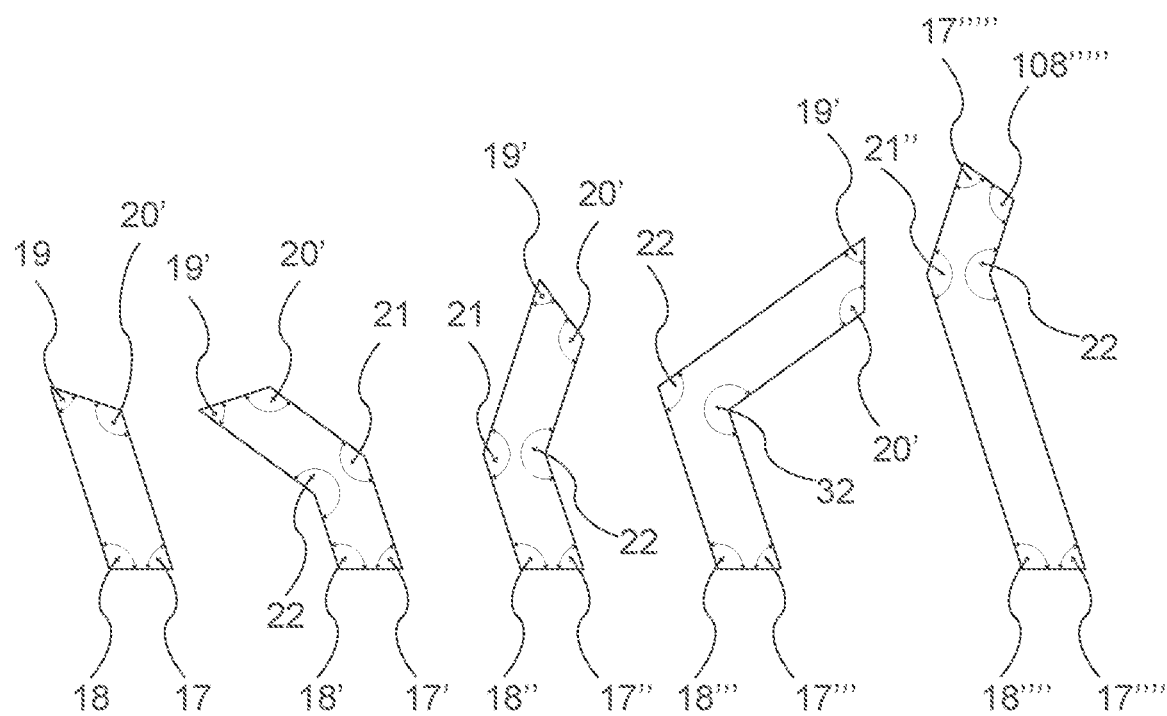
FIG. 7 shows the interior angles of the respective elements of the kit shown in FIG. 5, according to exemplary implementations of the inventive concepts disclosed herein.

FIG. 7 shows the interior angles of the respective elements of the kit shown in FIG. 5, according to exemplary implementations of the inventive concepts disclosed herein. All interior angles of the elements are multiples of 18°; for example, the angles 17 are 72°, the angles 18 are 108°, the angles 19 are 54°, the angles 20 are 126°, the angles 21 are 144°, the angles 22 are 216°, and the angle 32 is 252°.

FIGS. 8A-8E are top, bottom, side, top right isometric, and lower left isometric views of the element 9 of the kit shown in FIG. 5, in which the element is formed as a tray (e.g., for holding architectural surface materials, biological systems, or various electronic components), according to exemplary implementations of the inventive concepts disclosed herein. FIGS. 9A-9E are top, bottom, side, top right isometric, and lower left isometric views of the element 10 of the kit shown in FIG. 5, in which the element is formed as a tray (e.g., for holding architectural surface materials, biological systems, or various electronic components), according to exemplary implementations of the inventive concepts disclosed herein. FIGS. 10A-10E are top, bottom, side, top right isometric, and lower left isometric views of the element 11 of the kit shown in FIG. 5, in which the element is formed as a tray (e.g., for holding architectural surface materials, biological systems, or various electronic components), according to exemplary implementations of the inventive concepts disclosed herein. FIGS. 11A-11E are top, bottom, side, top right isometric, and lower left isometric views of the element 12 of the kit shown in FIG. 5, in which the element is formed as a tray (e.g., for holding architectural surface materials, biological systems, or various electronic components), according to exemplary implementations of the inventive concepts disclosed herein. FIGS. 12A-12E are top, bottom, side, top right isometric, and lower left isometric views of the element 13 of the kit shown in FIG. 5, in which the element is formed as a tray (e.g., for holding architectural surface materials, biological systems, or various electronic components), according to exemplary implementations of the inventive concepts disclosed herein.

In one aspect, the trays shown in the various views of FIGS. 8-12, may be essentially flat shallow containers including a rim around a perimeter of the element. In another aspect, the rims of the trays may be beveled rims 23 (e.g., sharply beveled back at 35.264°) so as to appear very light and 'paper thin' from a front view; in some instance, this enables maximum-width viewing angle of the depopulated negative space between respective trays arranged with respect to one another to form a girih strapwork pattern. Alternatively, trays could be designed to have no bevel at all and have essentially straight rims, for a more solid, extruded look. In another aspect, the trays may have one or more holes 25 cut out on a rear surface 24 of the tray for cables to pass through from internal electronics (after which strain-relief could be added on the outside of the tray to secure it). In yet another aspect, the trays may include one or more magnets 26 on the rear surface 24 for coupling respective strays to a support structure for the girih strapwork pattern.

Figure 13A:
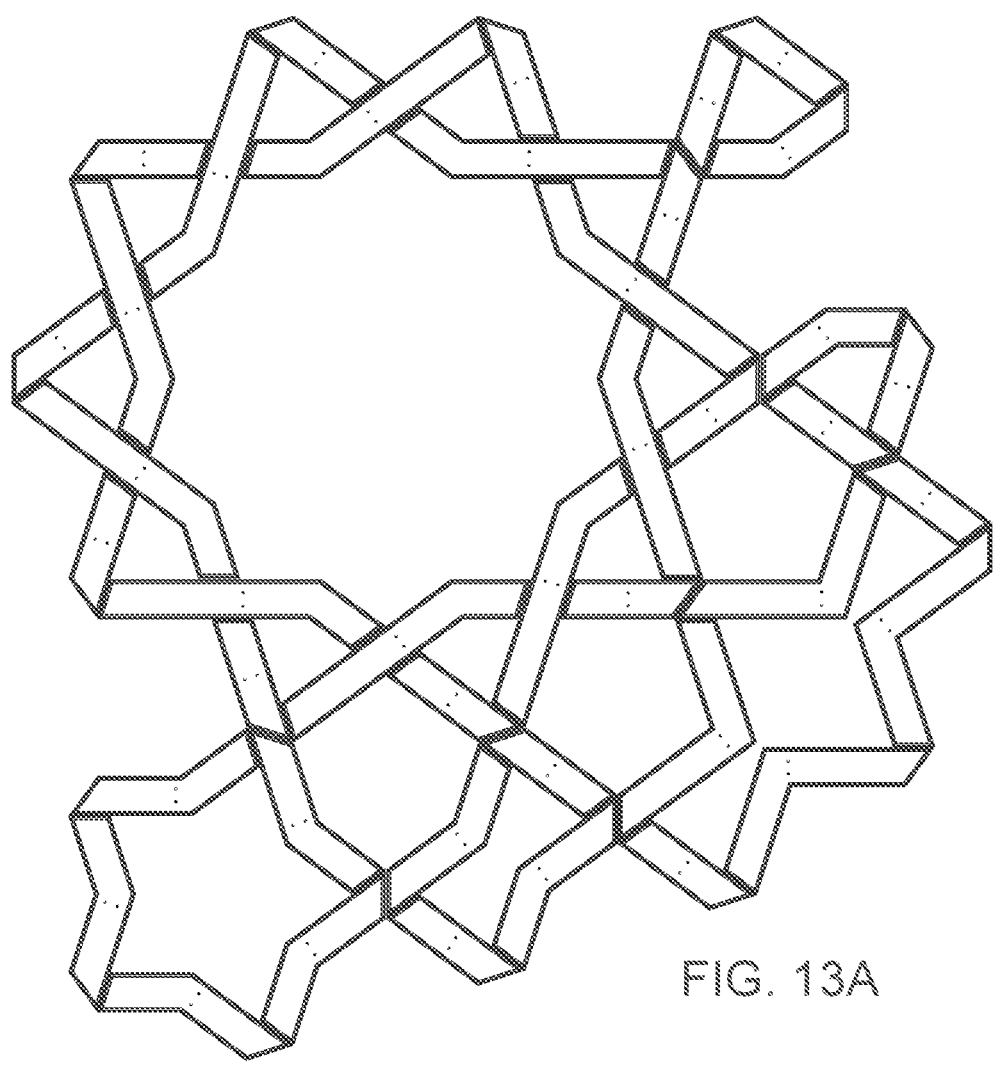
FIGS. 13A-B show top and isometric views of the trays shown in FIGS. 8-12 arranged in an example of a girih strapwork pattern, according to exemplary implementations of the inventive concepts disclosed herein.
Figure 13B:
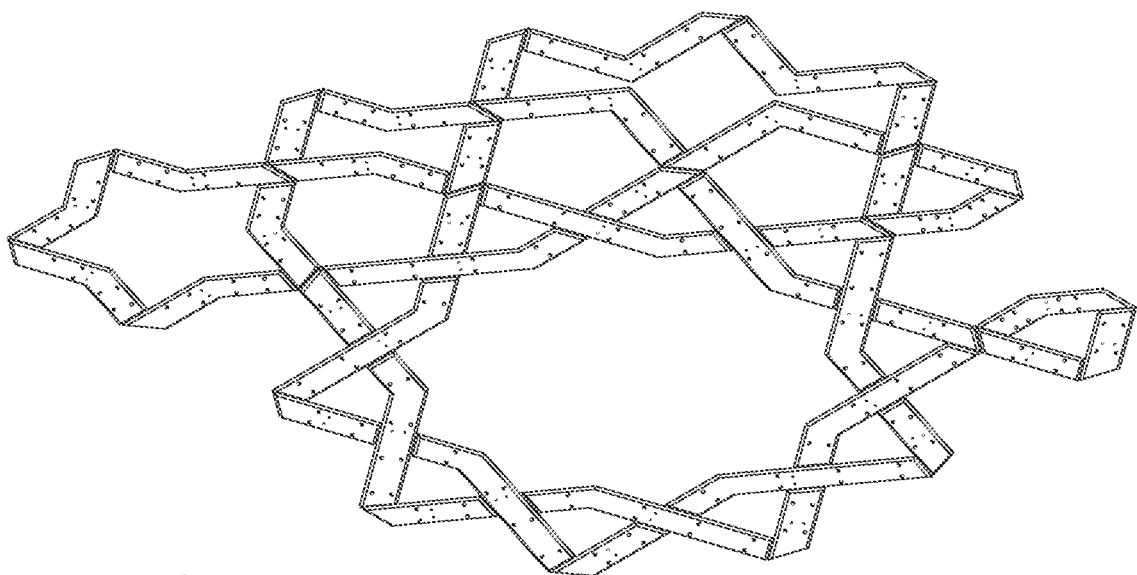

In some implementations, one or more of the elements of a kit may be configured as a tray (e.g., according to the concepts disclosed above in connection with FIGS. 8-12) to support a variety of ornamental or functional components disposed in or on the tray. Examples of such components may include, and are not limited to: architectural surface materials such as wood, glass, or metal; biological systems that can support living plant life; and electronic components such as photovoltaics/solar panels, video display components (LED, LCD, OLED, etc.), lighting components (LED, incandescent, etc.), audio speakers, cameras, various types of sensors (e.g., infrared sensors, accelerometers), printed circuit boards and slim and/or interchangeable electronic sub-components (e.g., power supplies, data cards). Such trays supporting ornamental or functional components provide for a variety of creative designs and structural/sculptural installations for built environments. FIGS. 13A-B show top and isometric views of a plurality of such trays arranged in an example of a girth strapwork pattern, according to exemplary implementations of the inventive concepts disclosed herein.

CONCLUSION

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

Also, various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of" "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

The invention claimed is:

1. A kit, comprising a plurality of elements, each element from the plurality of elements being an elongate polygon, wherein:
    each element from the plurality of elements has at least two longer sides that are parallel to each other;
    each element from the plurality of elements has at least two shorter sides that are non-parallel to each other;
    a first shorter side of each element from the plurality of elements has a same first length; and
    the plurality of elements are configured to be arranged to form a girth strapwork pattern.

2. The kit of claim 1, wherein at least one of the at least two shorter side of each element from the plurality of elements is at a first angle of 72 degrees with respect to one of the at least two longer sides of that element and at a second angle of 108 degrees with respect to another of the at least two longer sides of that element.

3. The kit of claim 1, wherein:
    a first group of the plurality of elements has a first unique shape;
    a second group of the plurality of elements has a second unique shape different from the first unique shape; and
    at least one of the at least two shorter sides of each element from the plurality of elements is at a first angle of 72 degrees with respect to one of the at least two longer sides of that element and at a second angle of 108 degrees with respect to another of the at least two longer sides of that element.

4. The kit of claim 1, wherein the kit includes:
    a first element from the plurality of elements having two shorter sides and two longer sides, a first interior angle of 54 degrees, a second internal angle of 126 degrees, a third interior angle of 108 degrees, and a fourth interior angle of 72 degrees; and
    a second element from the plurality of elements, the second element being a concave polygon having:
        a first longer side that forms a first interior angle of 108 degrees with at least one of the at least two shorter sides,
        a second longer side that forms a second interior angle of 216 degrees with the first longer side, and
        another of the at least two shorter sides that forms a third interior angle of 54 degrees with the second longer side.

5. The kit of claim 1, wherein the kit includes:
    a first element from the plurality of elements, the first element being a concave polygon having:
        a first longer side that form a first interior angle of 108 degrees with at least one of the at least two shorter sides,
        a second longer side that forms a second interior angle of 144 degrees with the first longer side, and
        another of the at least two shorter sides that forms a third interior angle of 54 degrees with the second longer side.

6. The kit of claim 1, wherein the kit includes:
    a first element from the plurality of elements having two shorter sides and two longer sides, a first interior angle of 54 degrees, a second internal angle of 126 degrees, a third interior angle of 108 degrees, and a fourth interior angle of 72 degrees; and
    a second element from the plurality of elements, the second element being a concave polygon having:
        a first longer side that form a first interior angle 72 degrees with at least one of the at least two shorter sides,
        a second longer side that forms a second interior angle of 252 degrees with the first longer side, and
        another of the at least two shorter sides that forms a third interior angle of 126 degrees with the second longer side.

7. The kit of claim 1, wherein the kit includes:
    a first element from the plurality of elements having two shorter sides and two longer sides, a first interior angle of 54 degrees, a second internal angle of 126 degrees, a third interior angle of 108 degrees, and a fourth interior angle of 72 degrees; and
    a second element from the plurality of elements, the second element being a concave polygon having:
        a first longer side that form a first interior angle of 108 degrees with at least one of the at least two shorter sides,
        a second longer side that forms a second interior angle of 144 degrees with the first longer side, and
        another of the at least two shorter sides that forms a third interior angle of 72 degrees with the second longer side.

8. The kit of claim 1, wherein the kit includes:
    a first element from the plurality of elements having two shorter sides and two longer sides, a first interior angle of 54 degrees, a second internal angle of 126 degrees, a third interior angle of 108 degrees, and a fourth interior angle of 72 degrees; and
    a second element from the plurality of elements, the second element being a concave polygon having:
        a first longer side that form a first interior angle of 108 degrees with at least one of the at least two shorter sides,
        a second longer side that forms a second interior angle of 144 degrees with the first longer side, and another of the at least two shorter sides that forms a third interior angle of 54 degrees with the second longer side.

9. The kit of claim 1, wherein the plurality of elements includes:
a first group of elements, a second shorter side of each element from the first group of elements having a second same length; and
a second group of elements, a second shorter side of each element from the second group of elements having a third same length, the third same length being different from the second same length.

10. The kit of claim 1, wherein:
each element from the plurality of elements has one of five unique shapes;
a first unique shape from the five unique shapes having two shorter sides and two longer sides, a first interior angle of 54 degrees, a second internal angle of 126 degrees, a third interior angle of 108 degrees, and a fourth interior angle of 72 degrees;
a second unique shape from the five unique shapes being a concave polygon having:
 a first longer side that form a first interior angle of 108 degrees with at least one of the at least two shorter sides,
 a second longer side that forms a second interior angle of 216 degrees with the first longer side, and
 another of the at least two shorter sides that forms a third interior angle of 54 degrees with the second longer side;
a third unique shape from the five unique shapes being a concave polygon having:
 a first longer side that forms a first interior angle of 108 degrees with at least one of the at least two shorter sides,
 a second longer side that forms a second interior angle of 144 degrees with the first longer side, and
 another of the at least two shorter sides that forms a third interior angle of 54 degrees with the second longer side;
a fourth unique shape from the five unique shapes being a concave polygon having:
 a first longer side that form a first interior angle of 72 degrees with at least one of the at least two shorter sides,
 a second longer side that forms a second interior angle of 252 degrees with the first longer side, and
 another of the at least two shorter sides that forms a third interior angle of 126 degrees with the second longer side;
a fifth unique shape from the five unique shapes being a concave polygon having:
 a first longer side that form a first interior angle of 108 degrees with at least one of the at least two shorter sides,
 a second longer side that forms a second interior angle of 144 degrees with the first longer side, and
 another of the at least two shorter sides that forms a third interior angle of 72 degrees with the second longer side.

11. The kit of claim 1, wherein:
each element from the plurality of elements has an exposed visible surface between the at least two longer sides that are parallel to each other; and
each longer side of the at least two longer sides of each element from the plurality of elements includes a bezel or a border that is visibly different than the exposed visible surface.

12. The kit of claim 1, wherein a first element from the plurality of elements is formed as a tray.

13. The kit claim 1, wherein a first element from the plurality of elements is formed as a tray having a beveled rim.

14. The kit of claim 1, wherein:
a first element from the plurality of elements is formed as a tray; and
the first element from the plurality of elements includes at least one magnet disposed in or on the tray to facilitate mechanical coupling of the tray to a support structure.

15. The kit of claim 1, wherein:
a first element from the plurality of elements is formed as a tray; and
disposed in or on the tray is at least one of:
 an architectural glass component,
 an architectural metal component,
 an architectural wood component,
 a biological system component configured to support living plant life,
 a photovoltaic component;
 a lighting component;
 a video display component;
 an audio speaker component;
 a camera component;
 an electronic sensor component;
 a printed circuit board, or
 an electronic power supply.

* * * * *

UNITED STATES PATENT AND TRADEMARK OFFICE
CERTIFICATE OF CORRECTION

PATENT NO. : 10,555,429 B2
APPLICATION NO. : 15/942623
DATED : February 4, 2020
INVENTOR(S) : John Frattalone Page 1 of 1

It is certified that error appears in the above-identified patent and that said Letters Patent is hereby corrected as shown below:

In the Claims

Column 7, Claim 1, Line 44:
"form a girth strapwork pattern."
Should read:
--form a girih strapwork pattern.--

Signed and Sealed this
Twelfth Day of May, 2020

Andrei Iancu
*Director of the United States Patent and Trademark Office*